(12) United States Patent (10) Patent No.: US 10,020,030 B2
Kim et al. (45) Date of Patent: Jul. 10, 2018

(54) SEMICONDUCTOR APPARATUS CAPABLE OF IMPROVING EFFICIENCY FOR A CIRCUIT CONFIGURATION AND A SIGNAL LINE INTERCONNECTION

(71) Applicant: SK hynix Inc., Icheon-si, Gyeonggi-do (KR)

(72) Inventors: Seung Bong Kim, Icheon-si (KR); Geun Il Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/048,529

(22) Filed: Feb. 19, 2016

(65) Prior Publication Data

US 2017/0125072 A1 May 4, 2017

(30) Foreign Application Priority Data

Nov. 3, 2015 (KR) .................. 10-2015-0153525

(51) Int. Cl.
| | | |
|---|---|---|
| G11C 7/10 | (2006.01) | |
| G11C 5/06 | (2006.01) | |
| G11C 7/06 | (2006.01) | |
| G11C 7/12 | (2006.01) | |
| G11C 8/08 | (2006.01) | |
| G11C 8/10 | (2006.01) | |
| G11C 29/00 | (2006.01) | |
| G11C 5/02 | (2006.01) | |

(52) U.S. Cl.
CPC .............. *G11C 7/10* (2013.01); *G11C 5/025* (2013.01); *G11C 5/063* (2013.01); *G11C 7/06* (2013.01); *G11C 7/12* (2013.01); *G11C 8/08* (2013.01); *G11C 8/10* (2013.01); *G11C 29/816* (2013.01); *G11C 29/84* (2013.01); *G11C 29/781* (2013.01); *G11C 2207/105* (2013.01)

(58) Field of Classification Search
CPC .. G11C 8/12; G11C 7/18; G11C 17/16; G11C 17/18
USPC ............ 365/52, 200, 225.7, 230.03; 714/764
See application file for complete search history.

(56) References Cited

U.S. PATENT DOCUMENTS

| | | | | |
|---|---|---|---|---|
| 5,659,513 | A * | 8/1997 | Hirose ..................... | G11C 7/14 365/225.7 |
| 5,771,195 | A * | 6/1998 | McClure ................ | G11C 29/24 365/200 |
| 5,999,480 | A * | 12/1999 | Ong ........................ | G11C 5/025 365/230.03 |
| 6,094,382 | A * | 7/2000 | Choi ....................... | G11C 29/80 365/230.03 |
| 6,335,875 | B2 * | 1/2002 | Ooishi .............. | H01L 27/10897 365/230.03 |
| 6,847,576 | B2 | 1/2005 | Kang | |
| 6,882,554 | B2 * | 4/2005 | Markert ................. | G11C 7/067 365/230.03 |

(Continued)

*Primary Examiner* — Alexander Sofocleous
*Assistant Examiner* — Alfredo Bermudez Lozada
(74) *Attorney, Agent, or Firm* — William Park & Associates Ltd.

(57) ABSTRACT

A semiconductor apparatus may be provided. The semiconductor apparatus may include a plurality of memory blocks. The semiconductor apparatus may include a peripheral circuit region arranged between the plurality of memory blocks. A plurality of signal input/output (I/O) pads may be arranged in the plurality of memory blocks.

5 Claims, 5 Drawing Sheets

(56) References Cited

U.S. PATENT DOCUMENTS

| | | | |
|---|---|---|---|
| 8,254,153 B2* | 8/2012 | Dono | G11C 5/02 |
| | | | 365/189.02 |
| 9,373,390 B1* | 6/2016 | Lee | G11C 7/22 |
| 2016/0048424 A1* | 2/2016 | Sakai | G06F 11/1008 |
| | | | 714/764 |

* cited by examiner

SEMICONDUCTOR APPARATUS CAPABLE OF IMPROVING EFFICIENCY FOR A CIRCUIT CONFIGURATION AND A SIGNAL LINE INTERCONNECTION

CROSS-REFERENCES TO RELATED APPLICATION

This application claims priority under 35 U.S.C. 119(a) to Korean application No. 10-2015-0153525, filed on Nov. 3, 2015, in the Korean intellectual property Office, which is incorporated by reference in its entirety as set forth in full.

BACKGROUND

1. Technical Field

Various embodiments generally relate to a semiconductor apparatus, and more particularly, to a semiconductor memory.

2. Related Art

In semiconductor apparatuses, for example, semiconductor memories, a plurality of complex circuit configurations including control circuits and the like related to a plurality of memory blocks have to be arranged in a peripheral region and control regions between the plurality of memory blocks. Additionally, signal lines according to the circuit configurations have to be arranged.

Input/output (I/O) pads have to be coupled to the circuit configurations, and thus it may be difficult to arrange the circuit configuration and to form signal line interconnections.

The arrangement of the circuit configuration and signal line interconnections may considerably affect operation characteristics of the semiconductor apparatuses.

SUMMARY

One or more exemplary embodiments are provided to a semiconductor apparatus capable of improving efficiency for a circuit configuration arrangement and a signal line interconnection.

According to an embodiment, there is provided a semiconductor apparatus. The semiconductor apparatus may include a peripheral circuit region; and a plurality of memory blocks arranged at both sides on the basis of the peripheral circuit region. A plurality of signal input/output (I/O) pads may be arranged in the plurality of memory blocks.

According to an embodiment, there is provided a semiconductor apparatus. The semiconductor apparatus may include a peripheral circuit region; and a plurality of memory blocks arranged at both sides on the basis of the peripheral circuit region. A plurality of column decoders configured to perform column access on the plurality of memory blocks may be arranged between an edge of the semiconductor apparatus and the plurality of memory blocks.

According to an embodiment, there is provided a semiconductor apparatus. The semiconductor apparatus may include a peripheral circuit region; a plurality of memory blocks arranged at both sides on the basis of the peripheral circuit region; a plurality of column decoders arranged between an edge of the semiconductor apparatus and the plurality of memory blocks; first control regions arranged between the plurality of memory blocks and the peripheral circuit region to a first direction; and a plurality of signal input/output (I/O) pads arranged in regions of the plurality of memory blocks, which are close to the first control regions.

These and other features, aspects, and embodiments are described below in the section entitled "DETAILED DESCRIPTION".

DETAILED DESCRIPTION

Figure 1:
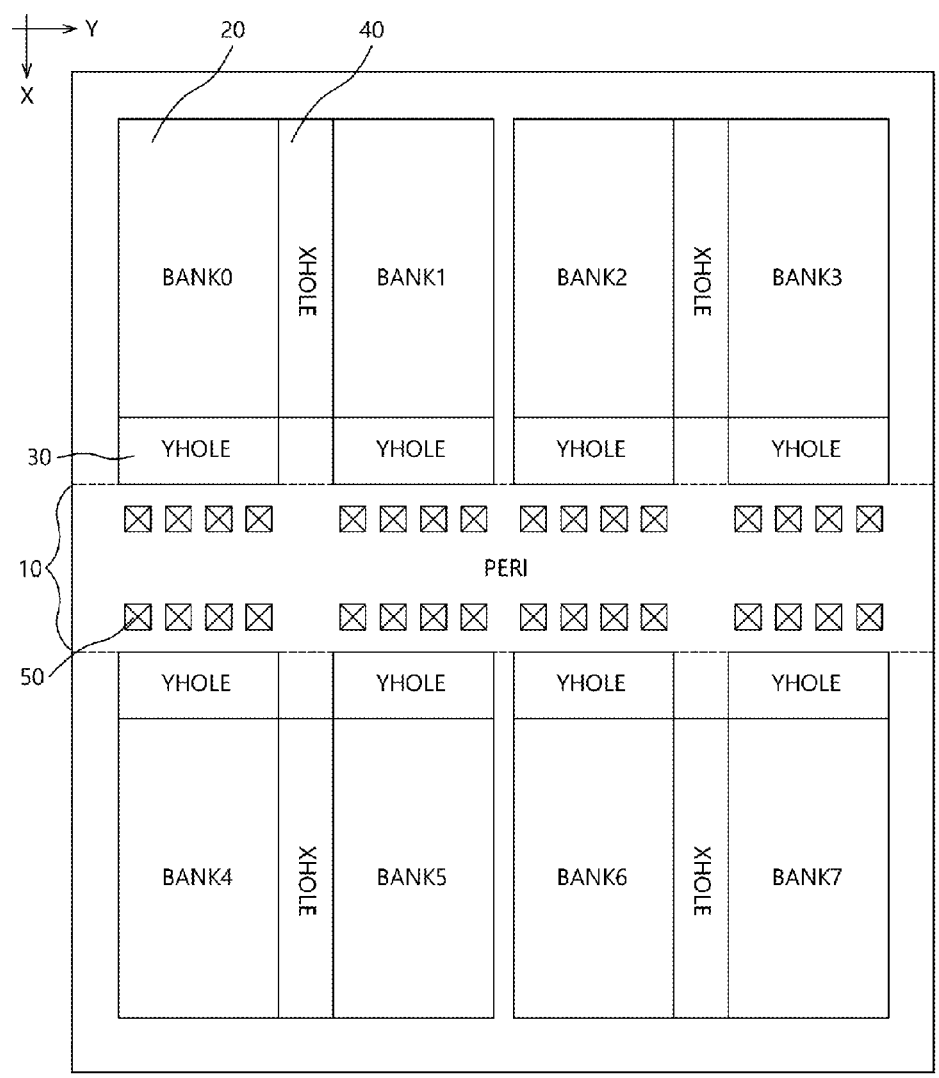
FIG. 1 is a layout diagram illustrating a representation of an example of a circuit arrangement of a semiconductor apparatus according to an embodiment.

Hereinafter, examples of embodiments will be described below with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, examples of embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Although a few embodiments will be illustrated and described, it will be appreciated by those of ordinary skill in the art that changes may be made in these examples of embodiments without departing from the principles and spirit of the descriptions.

Referring to FIG. 1, a semiconductor apparatus 1 according to an embodiment may include a peripheral circuit region 10, a plurality of memory blocks 20, a plurality of first control regions 30, a plurality of second control regions 40, and a plurality of signal input/output (I/O) pads 50.

The peripheral circuit region 10 may be indicated as PERI.

The plurality of memory blocks 20 may refer to, for example, a plurality of memory banks BANK0 to BANK7.

The plurality of first control regions 30 may be arranged in a first (Y) direction and may be indicated as YHOLE.

The plurality of second control regions 40 may be arranged in a second (X) direction and may be indicated as XHOLE.

The plurality of first control regions 30 and the plurality of second control regions 40 may include circuits related to signal I/O of the plurality of memory banks BANK0 to BANK7.

The plurality of memory banks BANK0 to BANK7 may be arranged at both sides on the basis of or with respect to the peripheral circuit region 10. That is, the plurality of memory banks BANK0 to BANK7 may be arranged with the peripheral circuit region 10 interposed there between. In an embodiment, for example, the peripheral circuit region 10 may be located between a first plurality of memory banks (i.e., BANK0 to BANK3) and a second plurality of memory banks (i.e., BANK4 to BANK7).

The memory banks BANK0 to BANK3 may be arranged in an upper side on the basis of or with respect to the peripheral circuit region 10 in the first (Y) direction.

The memory banks BANK4 to BANK7 may be arranged in a lower side on the basis of or with respect to the peripheral circuit region 10 in the first (Y) direction.

The plurality of first control regions 30 may be arranged between the plurality of memory banks BANK0 to BANK7 and the peripheral circuit region 10 along the first (Y) direction.

The plurality of second control regions 40 may be arranged between the plurality of memory banks BANK0 to BANK7 in the second (X) direction. In an embodiment, for example, a second control region 40 may be located between a pair of memory banks (i.e., BANK0 and BANK1, BANK2 and BANK3, BANK4 and BANK5, and/or BANK 6 and BANK7).

The plurality of signal I/O pads 50 may be arranged in the peripheral circuit region 10.

Figure 2:
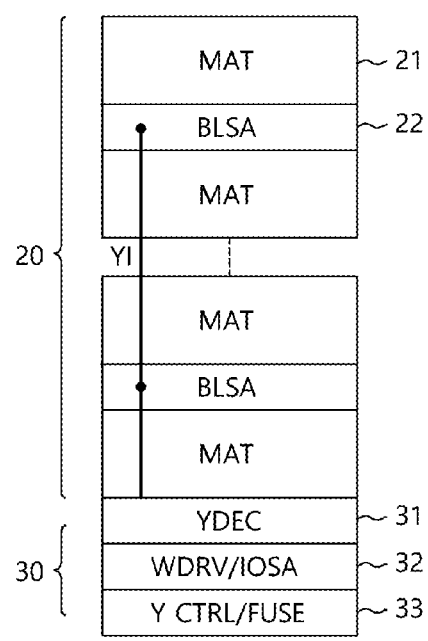
FIG. 2 is a diagram illustrating a representation of an example of a configuration of a memory block and a first control region of FIG. 1.

Referring to FIG. 2, each of the plurality of memory banks (BANK0 to BANK7) 20 may include a plurality of unit memory blocks (MAT) 21 and a plurality of bit line sense amplifier arrays (BLSA) 22 arranged between the plurality of unit memory blocks MAT.

The plurality of bit line sense amplifier arrays 22 may be configured to sense and amplify signals of bit lines (not illustrated) of unit memory blocks MAT arranged in upper/lower sides of the plurality of bit line sense amplifier arrays 22.

Each of the plurality of first control regions 30 may include a column decoder (YDEC) 31, a write driver and I/O sense amplifier array (WDRV/IOSA) 32, and a control logic/fuse array (YCTRL/FUSE) 33.

The column decoder 31 may generate a column selection signal YI for selecting the bit line sense amplifier arrays BLSA in a column direction.

A signal line for transmitting the column selection signal YI may be arranged from the column decoder 31 to the uppermost bit line sense amplifier array BLSA. In an embodiment, for example, a signal line for transmitting the column selection signal YI may be arranged from the column decoder 31 to the furthest bit line sense amplifier array BLSA from the column decoder 31.

The write driver WDRV may record data, input from the outside of the semiconductor apparatus 1, in the plurality of unit memory blocks MAT.

The I/O sense amplifier array IOSA may sense and amplify a signal between the bit line sense amplifier array BLSA and a data I/O line, for example, between the bit line sense amplifier array BLSA and a local I/O line (LIO) (not illustrated).

Figure 3:
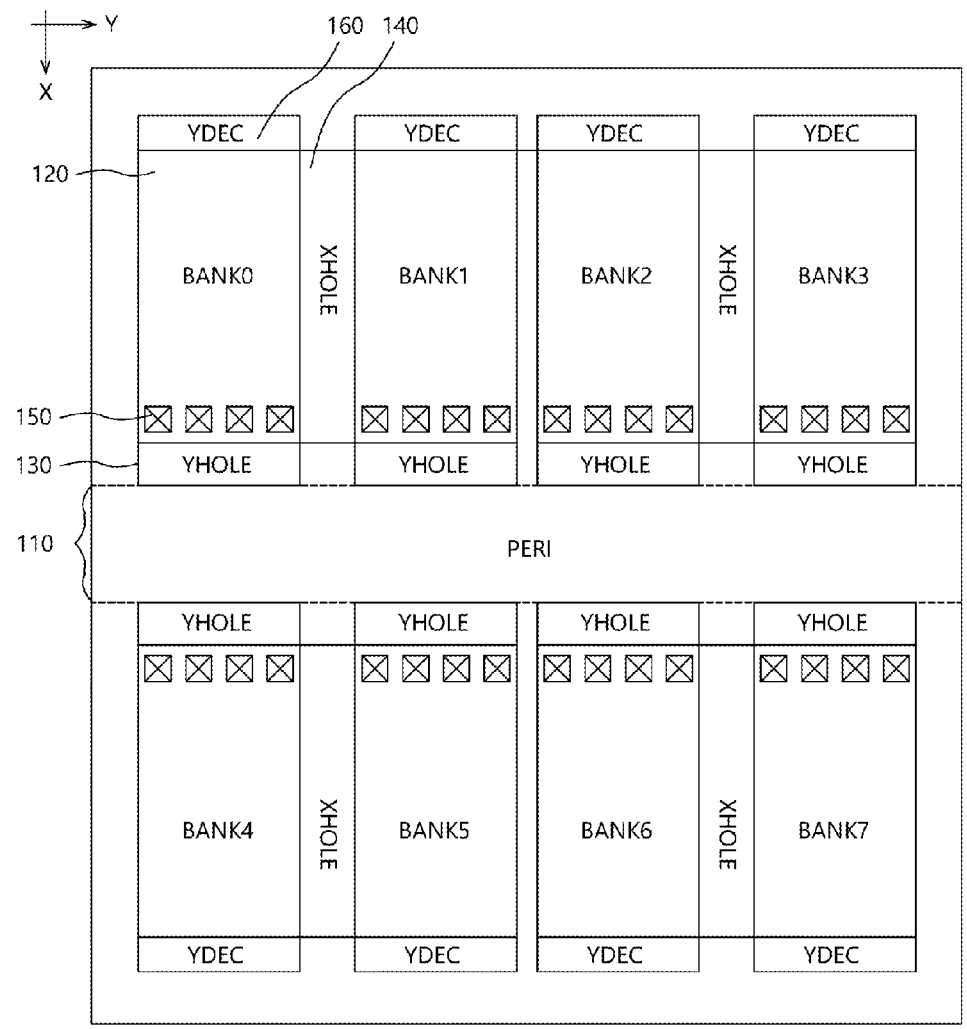
FIG. 3 is a layout diagram illustrating a representation of an example of a circuit arrangement of a semiconductor apparatus according to an embodiment.

Referring to FIG. 3, a semiconductor apparatus 2 according to an example of an embodiment may include a peripheral circuit region 110, a plurality of memory blocks 120, a plurality of first control regions 130, a plurality of second control regions 140, a plurality of signal I/O pads 150, and a plurality of column decoders 160.

The plurality of memory blocks 120 may refer to, for example, a plurality of memory banks BANK0 to BANK7.

The plurality of first control regions 130 may be arranged in a first (Y) direction and may be indicated as YHOLE.

The plurality of second control regions 140 may be arranged in a second (X) direction and may be indicated as XHOLE.

The plurality of first control regions 130 and the plurality of second control regions 140 may include circuits related to signal I/O of the plurality of memory banks BANK0 to BANK7.

The plurality of memory banks BANK0 to BANK7 may be arranged at both sides on the basis of or with respect to the peripheral circuit region 110. That is, the plurality of memory banks BANK0 to BANK7 may be arranged with the peripheral circuit region 110 interposed there between. In an embodiment, for example, the peripheral circuit region 110 may be located between a first plurality of memory banks (i.e., BANK0 to BANK3) and a second plurality of memory banks (i.e., BANK4 to BANK7).

The memory banks BANK0 to BANK3 may be arranged in an upper side on the basis of or with respect to the peripheral circuit region 110 in the first (Y) direction.

The memory blocks BANK4 to BANK7 may be arranged in a lower side on the basis of or with respect to the peripheral circuit region 110 in the first (Y) direction.

The plurality of first control regions 130 may be arranged between the plurality of memory banks BANK0 to BANK7 and the peripheral circuit region 110 along the first (Y) direction.

The plurality of second control regions 140 may be arranged between the plurality of memory banks BANK0 to BANK7 in the second (X) direction. In an embodiment, for example, a second control region 140 may be located between a pair of memory banks (i.e., BANK0 and BANK1, BANK2 and BANK3, BANK4 and BANK5, and/or BANK 6 and BANK7).

The plurality of signal I/O pads 150 may be arranged in regions of the plurality of memory banks BANK0 to BANK7, which are close to the first control regions 130. In an embodiment, for example, the plurality of signal I/O pads 150 may be arranged in regions of the plurality of memory banks BANK0 to BANK7, which are adjacent to the first control regions 130.

The plurality of column decoders YDEC 160 may be arranged between the plurality of memory banks BANK0 to BANK7 and an edge of the semiconductor apparatus 2, for example, between the plurality of memory banks BANK0 to BANK7 and an edge of a semiconductor chip.

In the semiconductor apparatus 1 according to an embodiment described with reference to FIGS. 1 and 2, the column decoder 31 may be arranged in each of the first control regions 30.

In the semiconductor apparatus 2 according to an embodiment described with reference to FIG. 3, the column decoders 160 may be arranged between the plurality of memory banks BANK0 to BANK7 and the edge of the semiconductor chip differently from the column decoder 31 arranged in the first control region 30 of FIG. 2.

Figure 4:
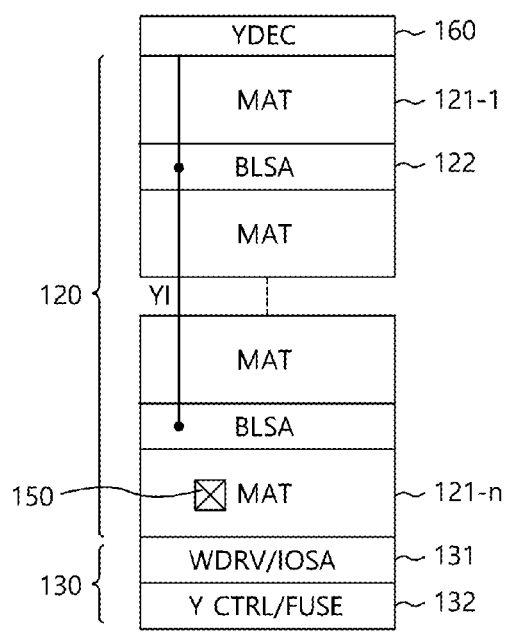
FIG. 4 is a diagram illustrating a representation of an example of a configuration of a memory block and a first control region of FIG. 3.

Referring to FIG. 4, each of the plurality of memory banks BANK0 to BANK7 may include a plurality of unit memory blocks (MAT) 121-1 to 121-$n$ and a plurality of bit line sense amplifier arrays BLSA 122 arranged between the plurality of unit memory clocks 121-1 to 121-$n$. For example, in an embodiment, a bit line sense amplifier array BLSA 122 may be located between a unit memory block MAT and another unit memory block MAT.

The plurality of bit line sense amplifier arrays 122 may be configured to sense and amplify signals of bit lines (not illustrated) of the unit memory blocks MAT in upper sides/lower sides of the bit line sense amplifier arrays 122.

The column decoder YDEC may be arranged in the edge region of the semiconductor chip close to the uppermost unit memory block 121-1.

The signal I/O pads 150 may be arranged in the lowermost unit memory block 121-*n* close to the first control region 130 among the plurality of unit memory blocks 121-1 to 121-*n*. For example, in an embodiment, signal I/O pads 150 may be arranged in the lowermost unit memory block 121-*n* closest to the first control region 130 among the plurality of unit memory blocks 121-1 to 121-*n*.

The column decoder 160 may generate a column selection signal YI for selecting the bit line sense amplifier arrays BLSA in a column direction. For example, in an embodiment, the column selection signal YI may select the bit line sense amplifier arrays BLSA arranged in a column direction.

Since a signal line for transmitting the column selection signal YI is arranged from the column decoder 160 to the lowermost bit line sense amplifier array BLSA, an interconnection for the signal line for transmitting the column selection signal YI may not be formed in the lowermost unit memory block 121-*n*. In an embodiment, for example, since a signal line for transmitting the column selection signal YI is arranged from the column decoder 160 to the bit line sense amplifier array BLSA located closest to first control region 130, an interconnection for the signal line for transmitting the column selection signal YI may not be formed in the unit memory block 121-*n* located closest to the first control region unit 130.

Since the interconnection for the signal line for transmitting the column selection signal YI is not arranged in the lowermost unit memory block 121-*n*, a spare space may be ensured in the lowermost unit memory block 121-*n*, and the signal I/O pads 150 may be arranged in the spare space of the lowermost unit memory block 121-*n*. In an embodiment, for example, since the interconnection for the signal line for transmitting the column selection signal YI is not arranged in the unit memory block 121-*n* located closest to the first control region, a spare space may be ensured in the unit memory block 121-*n* located closest to the first control region, and the signal I/O pads 150 may be arranged in the spare space of the unit memory block 121-*n* located closest to the first control region.

Since the column decoder 160 is arranged in the edge region of the semiconductor chip close to the uppermost unit memory block 121-1, each of the plurality of first control regions 130 may include a write driver and I/O sense amplifier array (WDRV/IOSA) 131 and a control logic/fuse array (YCTRL/FUSE) 132. In an embodiment, for example, since the column decoder 160 is arranged in the edge region of the semiconductor chip closest to the unit memory block 121-1 located furthest away from the first control region, each of the plurality of first control regions 130 may include a write driver and I/O sense amplifier array (WDRV/IOSA) 131 and a control logic/fuse array (YCTRL/FUSE) 132.

The write driver WDRV may record data, input from the outside of the semiconductor apparatus 2, in the plurality of unit memory blocks MAT.

The I/O sense amplifier array IOSA may sense and amplify a signal between the bit line sense amplifier array BLSA and a data I/O line, for example, between the bit line sense amplifier array BLSA and a local I/O line (LIO) (not illustrated).

Figure 5:
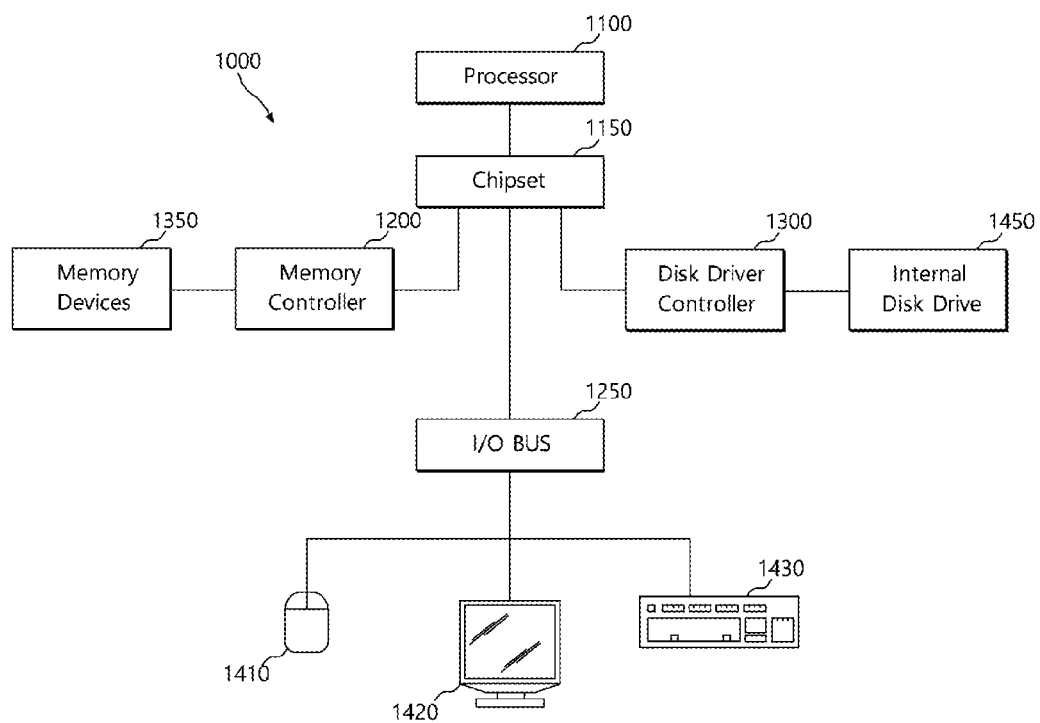
FIG. 5 illustrates a block diagram of an example of a representation of a system employing a semiconductor apparatus with the various embodiments discussed above with relation to FIGS. 1-4.

The semiconductor apparatus s discussed above (see FIGS. 1-4) are particular useful in the design of memory devices, processors, and computer systems. For example, referring to FIG. 5, a block diagram of a system employing a semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor apparatus as discussed above with relation to FIGS. 1-4. In alternate embodiments, such as, for example but not limited to, cellular phones or digital cameras, the components may differ from the embodiments illustrated in FIG. 5.

The above embodiments are illustrative and not limitative. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor apparatus comprising:
    a plurality of unit memory blocks;
    a plurality of bit line sense amplifier arrays each shared by two of the plurality of unit memory blocks; and
    a plurality of column decoders configured to generate a column selection signal to access the plurality of unit memory blocks,
    wherein a signal line for transmitting the column selection signal is arranged from the plurality of column decoders, via the plurality of unit memory blocks except one of the plurality of unit memory blocks, to the plurality of bit line sense amplifier arrays.

2. The semiconductor apparatus of claim 1, wherein a plurality of signal input/output (I/O) pads are arranged in the plurality of unit memory blocks.

3. The semiconductor apparatus of claim 1, wherein a plurality of signal I/O pads are arranged in the one of the plurality of unit memory blocks.

4. The semiconductor apparatus of claim 1, further comprising:
    first control regions arranged between the plurality of unit memory blocks and a peripheral circuit region in a first direction; and
    second control regions arranged between the plurality of unit memory blocks in a second direction.

5. The semiconductor apparatus of claim 4, wherein each of the first control regions includes an input/output (I/O) sense amplifier array and a write driver.

* * * * *